(12) United States Patent
Zheng (10) Patent No.: US 12,200,858 B2
(45) Date of Patent: Jan. 14, 2025

(54) FOLDABLE SCREEN DEVICE AND FLEXIBLE DISPLAY MODULE THEREOF

(71) Applicant: WUHAN CHINA STAR OPTOELECTRONICS SEMICONDUCTOR DISPLAY TECHNOLOGY CO., LTD., Wuhan (CN)

(72) Inventor: Bingwen Zheng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 254 days.

(21) Appl. No.: 17/771,600

(22) PCT Filed: Apr. 13, 2022

(86) PCT No.: PCT/CN2022/086650
§ 371 (c)(1),
(2) Date: Apr. 25, 2022

(87) PCT Pub. No.: WO2023/173523
PCT Pub. Date: Sep. 21, 2023

(65) Prior Publication Data
US 2023/0300973 A1     Sep. 21, 2023

(30) Foreign Application Priority Data
Mar. 17, 2022  (CN) .......................... 202210263825.7

(51) Int. Cl.
*H05K 1/02*     (2006.01)
*H05K 5/02*     (2006.01)

(52) U.S. Cl.
CPC ........... *H05K 1/028* (2013.01); *H05K 5/0217* (2013.01); *H05K 2201/10128* (2013.01)

(58) Field of Classification Search
CPC ................. H05K 1/028; H05K 5/0217; H05K 2201/10128
See application file for complete search history.

(56) References Cited

U.S. PATENT DOCUMENTS

2020/0035143 A1\*  1/2020  Lee ...................... G09G 3/3688
2021/0127506 A1   4/2021  Sim et al.
(Continued)

FOREIGN PATENT DOCUMENTS

CN    208401905 U    1/2019
CN    209373960 U    9/2019
(Continued)

*Primary Examiner* — Hoa C Nguyen
(74) *Attorney, Agent, or Firm* — The Roy Gross Law Firm, LLC; Roy Gross (57) ABSTRACT

A foldable screen device and a flexible display module thereof are provided. Wherein, the flexible display module includes a flexible display main body and a flexible circuit board. The flexible circuit board includes a host board and two transfer terminals disposed opposite to each other. The host board is bonded to a surface of the flexible display main body facing away a light-emitting side. The two transfer terminals are respectively disposed on two ends of the flexible circuit board and are electrically connected to the host board to respectively connect to circuits of bodies on two ends of the foldable screen device. During assembly, the transfer terminals of the flexible circuit board of the present application only need to penetrate through the through holes at corresponding positions of the middle frame, then the transfer terminals can connect to circuits of bodies on two ends of the foldable screen device.

20 Claims, 7 Drawing Sheets

(56) References Cited

U.S. PATENT DOCUMENTS

| | | | |
|---|---|---|---|
| 2022/0129046 A1* | 4/2022 | Baek | G06F 1/1683 |
| 2022/0159847 A1* | 5/2022 | Ahn | G06F 1/1616 |
| 2022/0338362 A1* | 10/2022 | Morino | H05K 5/0226 |

FOREIGN PATENT DOCUMENTS

| CN | 209447443 U | 9/2019 |
|---|---|---|
| CN | 110381665 A | 10/2019 |
| CN | 110536542 A | 12/2019 |
| CN | 211479555 U | 9/2020 |
| CN | 111862824 A | 10/2020 |
| CN | 111986571 A | 11/2020 |
| CN | 112586091 A | 3/2021 |
| CN | 212782501 U | 3/2021 |
| CN | 113242643 A | 8/2021 |
| CN | 114038330 A | 2/2022 |
| WO | 2020214002 A1 | 10/2020 |

* cited by examiner

FOLDABLE SCREEN DEVICE AND FLEXIBLE DISPLAY MODULE THEREOF

CROSS REFERENCE TO RELATED APPLICATIONS

This application is a National Phase of PCT Patent Application No. PCT/CN2022/086650 having International filing date of Apr. 13, 2022, which claims the benefit of priority of Chinese Patent Application No. 202210263825.7, filed Mar. 17, 2022, the contents of which are all incorporated herein by reference in their entirety.

BACKGROUND OF INVENTION

Field of Invention

The present application relates to a display field, and particularly to a foldable screen device and a flexible display module thereof.

Description of Prior Art

With development of display technology, foldable displays are gradually budding in display markets, and a market share of the foldable displays is also increasing year by year.

Because a body of foldable screen device is divided into two parts, a battery, a main board, an antenna, and other components located inside the body are also divided into two parts and are mounted in the two parts of the body respectively. At this time, in order to realize communication and connection of each part of the body, additional transfer flexible circuit boards are needed for implementation. In the prior art, a specific structure of the foldable screen device is that grooves are defined on middle frames of the two parts of the body near rotating shafts, and then several transfer flexible circuit boards are penetrated through the grooves of the middle frame to connect and communicate with components located on two ends of the body. According to current design, assembly processes of the transfer flexible circuit boards are complicated because the transfer flexible circuit boards need to be formed in a fixed shape and be fixed in corresponding regions.

SUMMARY OF INVENTION

Embodiments of the present application provide a foldable screen device and a flexible display module thereof, which can solve technical problems that assembly processes of the transfer flexible circuit boards are complicated because the transfer flexible circuit boards need to be formed in a fixed shape and be fixed in corresponding regions in the prior art.

One embodiment of the present application provides a flexible display module, including a flexible display main body; a flexible circuit board including a host board and two transfer terminals disposed opposite to each other, wherein the host board is bonded to a surface of the flexible display main body facing away a light-emitting side, and the two transfer terminals are respectively disposed on two ends of the flexible circuit board and are electrically connected to the host board to respectively connect to circuits of bodies on two ends of the foldable screen device.

In some embodiments of the present application, the flexible display module includes: a metal plate disposed on a side of the flexible display main body facing toward a side of the flexible circuit board and connected and bonded to the flexible circuit board.

In some embodiments of the present application, the flexible circuit board is bonded to a surface of the metal plate facing toward the flexible display main body.

In some embodiments of the present application, the flexible display main body is configured to display. The flexible display module includes: a support layer disposed between the flexible display main body and the flexible circuit board, wherein a surface of the support layer is bonded to the flexible display main body to bear the flexible display main body, and another surface of the support layer is directly bonded to the flexible circuit board; a polarization layer disposed on a side of the flexible display main body facing away the support layer and bonded to the flexible display main body; a cover plate disposed on a side of the polarization layer facing away the flexible display main body and bonded to the flexible display main body.

In some embodiments of the present application, the flexible circuit board is bonded to a surface of the metal plate facing away the flexible display main body.

In some embodiments of the present application, the host board includes: two split portions disposed on the surface of the flexible display main body facing away the light-emitting side in a juxtaposition manner, and wherein at least one of the split portions is connected to the flexible display main body; a curved portion located at middle of the host board, wherein two ends of the curved portion are respectively connected to the two split portions.

In some embodiments of the present application, the flexible display module includes: a metal plate including a mesh portion and plate portions disposed on two sides of the mesh portion, the plate portions are respectively connected to and fixed with the two split portions, the mesh portion directly faces to the curved portion, and the mesh portion is curved in a bent state.

In some embodiments of the present application, a width of the mesh portion is less than a width of the curved portion; and wherein the width of the mesh portion refers to a distance between the plate portions in an unfolded state of the foldable screen device, and the width of the curved portion refers to a distance between the two split portions in the unfolded state of the foldable screen device.

In some embodiments of the present application, the curved portion includes a plurality of returned-bend sections connected to each other and forming a wave shape, and a cross section of the returned-bend sections is an arc.

In some embodiments of the present application, the two transfer terminals are located on a same side of the host board and protrude out of a lateral side of the host board.

In some embodiments of the present application, a module port is disposed on a side of the flexible display main body, the transfer terminals are bent back to a surface facing away the flexible display main body to connect to the circuits of the bodies on the two ends of the foldable screen device, and the module port is buckled to a surface of the transfer terminals facing away the flexible display main body.

Correspondingly, one embodiment on the present application further provides a foldable screen device, including a foldable middle frame and the aforesaid flexible display module. The middle frame includes a folding structure located at middle and a support structure disposed on two sides of the folding structure. The flexible display module is mounted on the support structure. Through holes are defined in regions where the support structure directly faces toward the transfer terminals. The transfer terminals penetrate the through holes to connect the circuits of the bodies on the two ends of the foldable screen device.

In some embodiments of the present application, the flexible display module includes: a metal plate disposed on the side of the flexible display main body facing away the light-emitting side, and wherein the flexible circuit board is directly bonded to the metal plate.

In some embodiments of the present application, the host board includes: two split portions disposed on the surface of the flexible display main body facing away from the light-emitting side in a juxtaposition manner, and wherein at least one of the split portions is connected to the flexible display main body; a curved portion located at middle of the host board, wherein two ends of the curved portion are respectively connected to the two split portions.

In some embodiments of the present application, the metal plate includes a mesh portion and plate portions disposed on two sides of the mesh portion, two plate portions are respectively connected to and fixed with the two split portions, the mesh portion directly faces to the curved portion, and the mesh portion is curved in a bent state.

In some embodiments of the present application, the flexible circuit board is located between the flexible display main body and the metal plate, openings are defined in regions where two plate portions correspond to the transfer terminals, after the transfer terminals has penetrated the openings and the through holes of the support structure, the transfer terminals are bent back to a back surface of the flexible display main body to connect to the circuits of the bodies on the two ends of the foldable screen device.

In some embodiments of the present application, the two transfer terminals are located on a same side of the host board and protrude out of a lateral side of the host board.

In some embodiments of the present application, the transfer terminals are bent back to a surface facing away the flexible display main body to connect to the circuits of the bodies on the two ends of the foldable screen device.

In some embodiments of the present application, a module port is disposed on a lateral section of the flexible display main body, after the module port has wound through the support structure, the module port is bent back to a surface facing away the flexible display main body and is buckled on a surface of the transfer terminal facing away the flexible display main body.

In some embodiments of the present application, the module port and the transfer terminals are located on adjacent lateral sides of the flexible display module.

In embodiments of the present application, by connecting and fixing the flexible circuit board used for transfer in the foldable screen device to the flexible display main body, one flexible display module is integrated and formed. During assembly, the transfer terminals of the flexible circuit board only need to penetrate through the through holes at corresponding positions of the middle frame, then the transfer terminals can connect to the circuits of the bodies on the two ends of the foldable screen device. Compared to a solution of penetrating grooves at rotating shafts in the prior art, the present application is more simple and easy, which solves the technical problem that assembly processes of the transfer flexible circuit boards are complicated because the transfer flexible circuit boards need to be formed in a fixed shape and be fixed in the corresponding regions in the prior art. Meanwhile, in the embodiments of the present application, after the flexible circuit board is connected to the circuits of the bodies on the two ends of the foldable screen device, connection and fixation between the flexible display main body and the flexible circuit board are also realized, which further simplifies the assembly structure.

DESCRIPTION OF DRAWINGS

To more clearly illustrate the technical solutions of the embodiments of the present application, the accompanying figures of the present application will be described in brief. Obviously, the accompanying figures described below are only part of the embodiments of the present application, from which figures those skilled in the art can derive further figures without making any inventive efforts.

description of reference numbers of accompanying figures:

10: foldable middle frame; 11: folding structure; 12: support structure; 13: through hole; 20: flexible display module; 100: flexible display main body; 101: straight portion; 102: bending portion; 131: module port; 200: flexible circuit board; 210: host board; 211: curved portion 2111: returned-bend section; 212: split portion; 220: transfer terminal; 230: terminal cable; 300: metal plate; 310 mesh portion; 320: plate portion; 321: opening; 400: buffer layer; 500: support layer: 600: polarization layer; 700: cover plate.

DETAILED DESCRIPTION OF EMBODIMENTS

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained by those skilled in the art based on the embodiments of the present disclosure without creative efforts are within the scope of the present disclosure. Besides, it should be understood that the specific embodiments described herein are merely for describing and explaining the present application and are not intended to limit the present application. In the present application, unless opposite stated, the orientation words used such as "upper" and "lower" generally refer to the upper and lower directions of the device in actual using or working state, and specifically refer to the drawing directions in the drawings, and "inner" and "outer" refer to the outline of the device.

Embodiments of the present application provide a foldable screen device and a flexible display module thereof. The details are described below respectively. It should be noted that a description order of the following embodiments is not intended to limit a preferred order of the embodiments.

The present application provides a foldable screen device. The foldable screen device can be a mobile phone, a tablet computer, a smart watch, or other wearable devices, etc.

Figure 1:
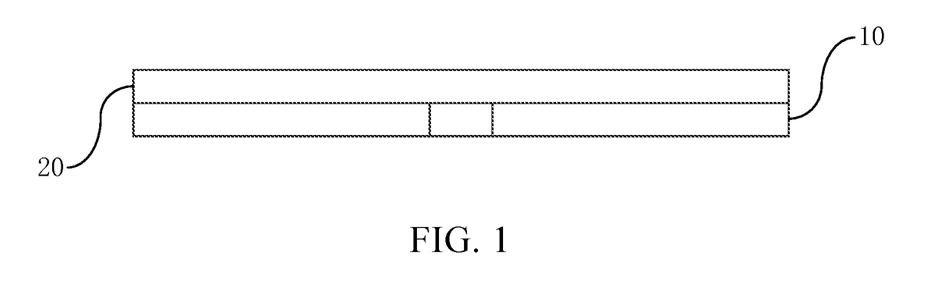
FIG. 1 is a structural schematic diagram of a foldable screen device provided by one embodiment of the present application.

Please refer to FIG. 1. The foldable screen device includes a foldable middle frame 10 and a flexible display module 20. The flexible display module 20 is mounted on the foldable middle frame 10. A side of the foldable middle frame 10 away from the flexible display module 20 is further configured to mount components such as main boards and batteries to form circuits of bodies on two ends of the foldable screen device.

Figure 2:
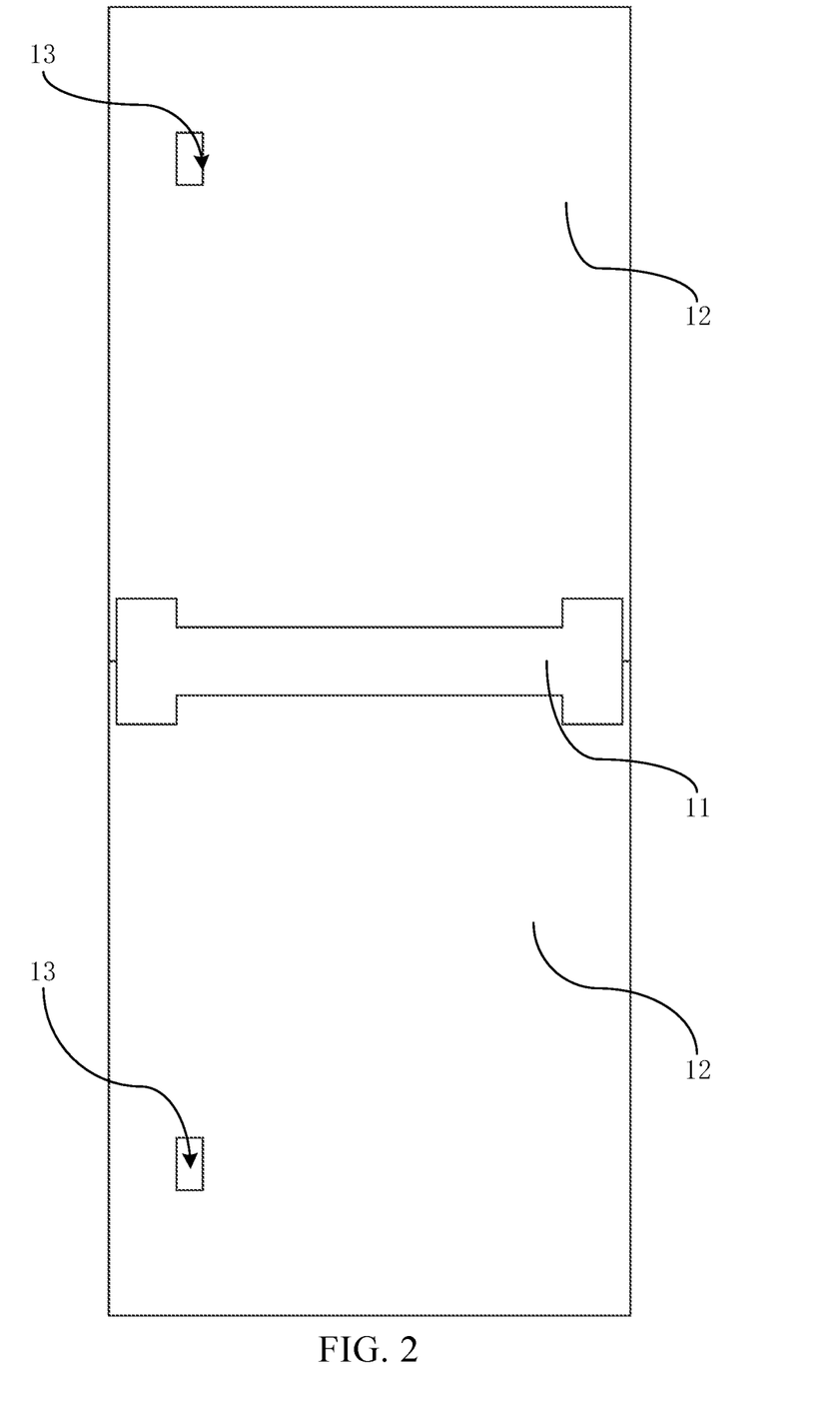
FIG. 2 is a structural schematic diagram of a foldable middle frame provided by one embodiment of the present application.

Wherein, please combine and refer to FIG. 2. The aforesaid foldable middle frame 10 includes a folding structure 11 at middle and a support structure 12 disposed on two sides of the folding structure 11. In this embodiment, the folding structure 11 is a rotating-shaft structure, and the support structure 12 is a support plate. A main board and a battery are connected and fixed on a same lateral surface of the foldable middle frame 10 and are respectively located on different support plates. The flexible display module 20 is disposed on another lateral surface of the foldable middle frame 10 and is fixed with two support plates respectively.

Figure 4:
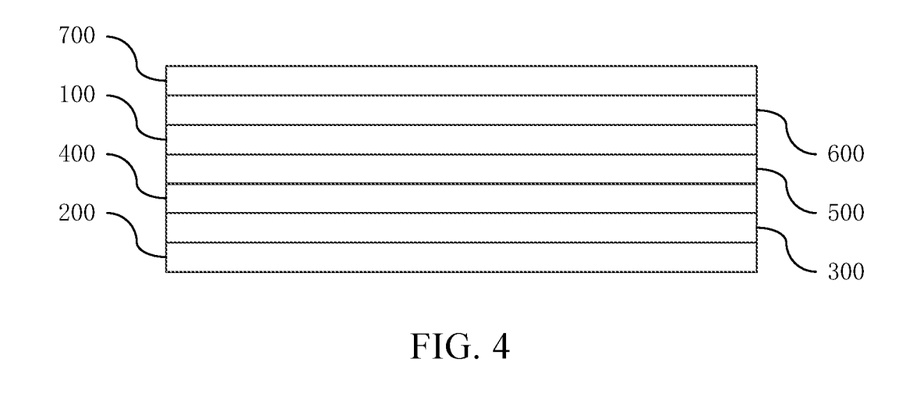
FIG. 4 is a schematic diagram of a detailed layer structure of the flexible display module provided by a first embodiment of the present application.

In a first embodiment of the present application, please combine and refer to FIG. 4. The flexible display module 20 includes a flexible display main body 100, a flexible circuit board 200, a metal plate 300, a buffer layer 400, a support layer 500, a flexible display main body 100, a polarization layer 600, and a cover plate 700.

In this embodiment, a light-emitting surface of the flexible display main body 100 is defined as a front surface, and an opposite surface thereof is a back surface. The buffer layer 400 is bonded to the metal plate 300 through an optical clear adhesive, acts as a substrate of the entire flexible display module 20, and has a certain buffer effect. Meanwhile, the buffer layer 400 is generally made of a black material to absorb natural light and prevent the natural light from being reflected outside, thereby ensuring display effect in a black screen state. The flexible circuit board 200 is bonded to a side of the metal plate 300 facing away the buffer layer 400. The support layer 500 is bonded to the buffer layer 400 and is configured to bear and support the flexible display main body 100. The flexible display main body 100 is bonded on the support layer 500. The polarization layer 600 is bonded on the flexible display main body 100. The cover plate 700 is manufactured by using a flexible transparent material. When display is performed, the flexible display main body 100 generates a screen light. The screen light penetrates through the polarization layer 600. A final screen is formed after processed by a polarizing treatment of the polarization layer 600. The final screen is displayed on the foldable device transparent by the cover plate 700 adopting the flexible transparent material.

Figure 3:
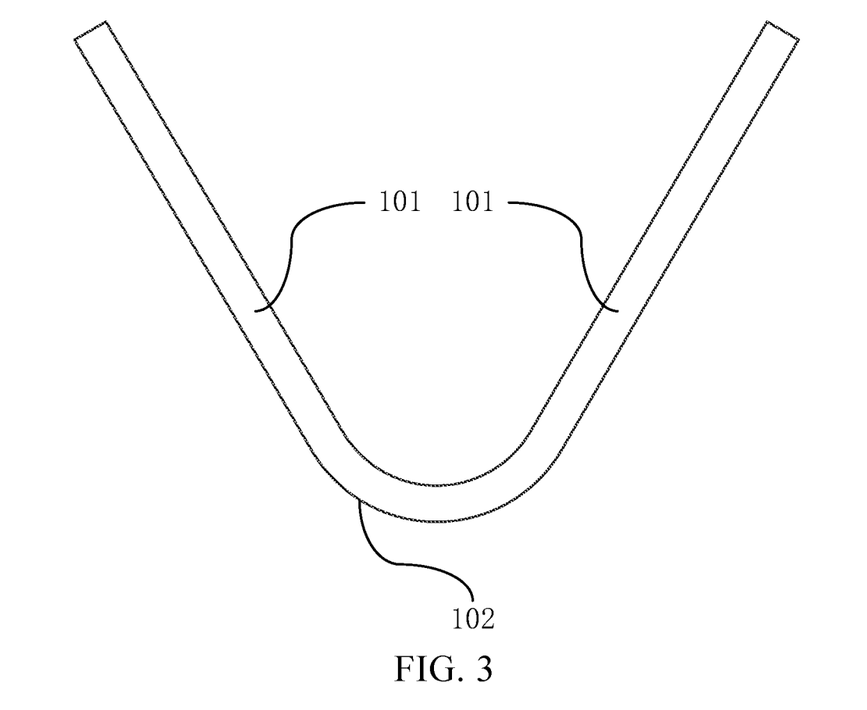
FIG. 3 is a structural schematic diagram of a flexible display module provided by one embodiment of the present application.

Please combine and refer to FIG. 3. The flexible display main body 100 includes a bending portion 102 located at middle and two straight portions 101 located on two sides. Two ends of the bending portion 102 are respectively connected and fixed with the two straight portions 101.

When the foldable screen device is in a bent state, the two bending portions 102 are disposed opposite to each other, and the bending portions 102 are in an arc return-bend shape with a large arc. When the foldable screen device is in an unfolded state, the two straight portions 101 are disposed in a juxtaposition manner, and the bending portions 102 are in a straight state or in an arc shape with a small arc.

Figure 5:
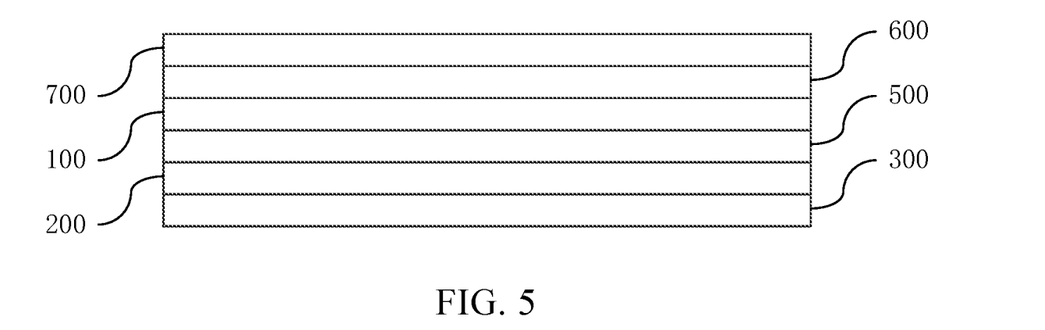
FIG. 5 is a schematic diagram of the detailed layer structure of the flexible display module provided by a second embodiment of the present application.

In a second embodiment of the present application, please combine and refer to FIG. 5. The flexible display module 20 includes a flexible display main body 100, a flexible circuit board 200, a metal plate 300, a support layer 500, a flexible display main body 100, a polarization layer 600, and a cover plate 700, but does not include a buffer layer 400.

In this embodiment, a light-emitting surface of the flexible display main body 100 is defined as a front surface, and an opposite surface thereof is a back surface. The flexible circuit board 200 is disposed between the support layer 500 and the metal plate 300 and is connected and fixed with the support layer 500 and the metal plate 300 respectively. Generally, a substrate of the flexible circuit board 200 is generally made of black polyethylene glycol terephthalate (PET) or polyimide (PI) and other materials, which has a certain buffer ability, while it can also absorb natural light, and serve a same buffer effect and an anti-reflection effect as the buffer layer 400. Therefore, the buffer layer 400 can be replaced, thereby simplifying the structure of the entire flexible display body 100 and saving the manufacturing cost.

Figure 6:
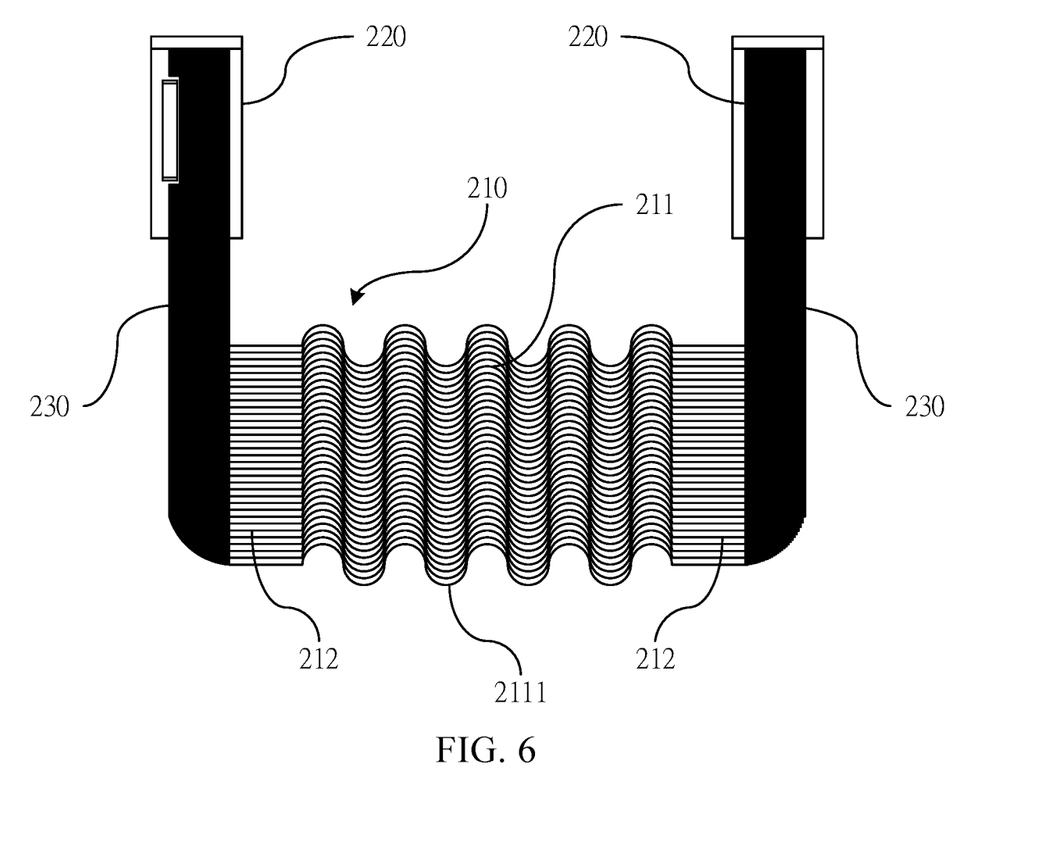
FIG. 6 is a structural schematic diagram of a flexible circuit board provided by one embodiment of the present application.
Figure 7:
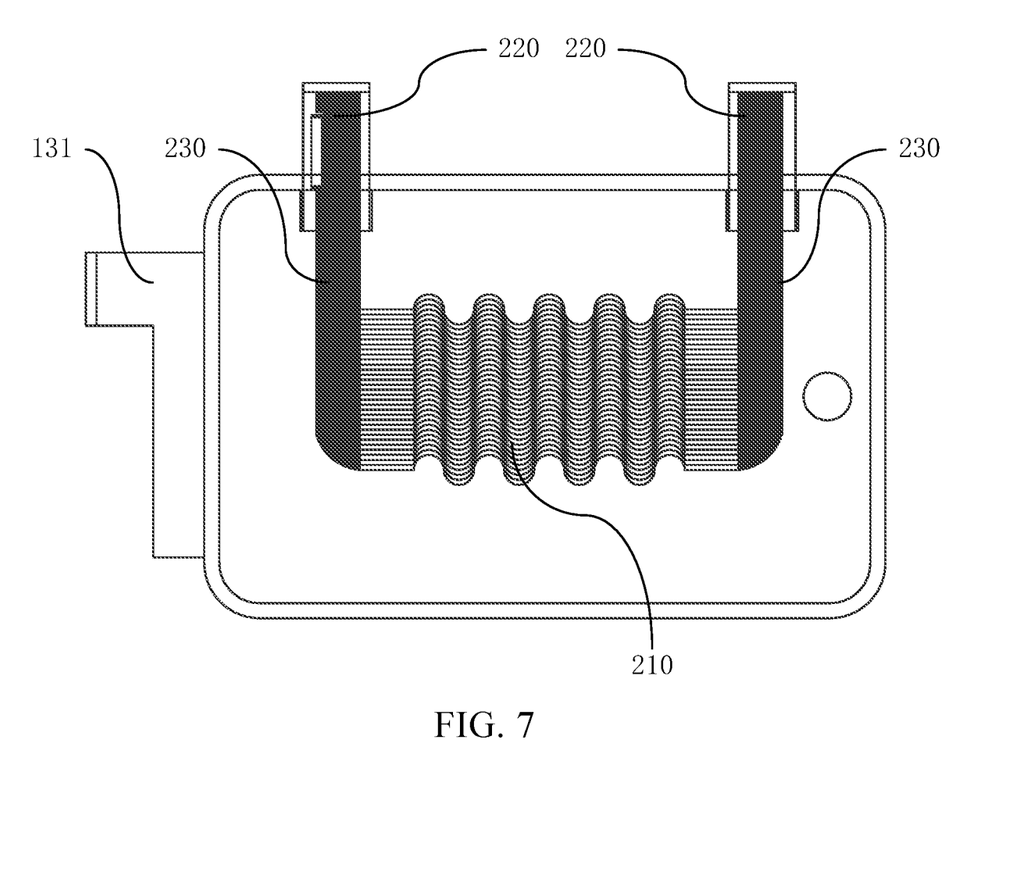
FIG. 7 is a schematic diagram of a back structure of the flexible display module provided by one embodiment of the present application.
Figure 8:
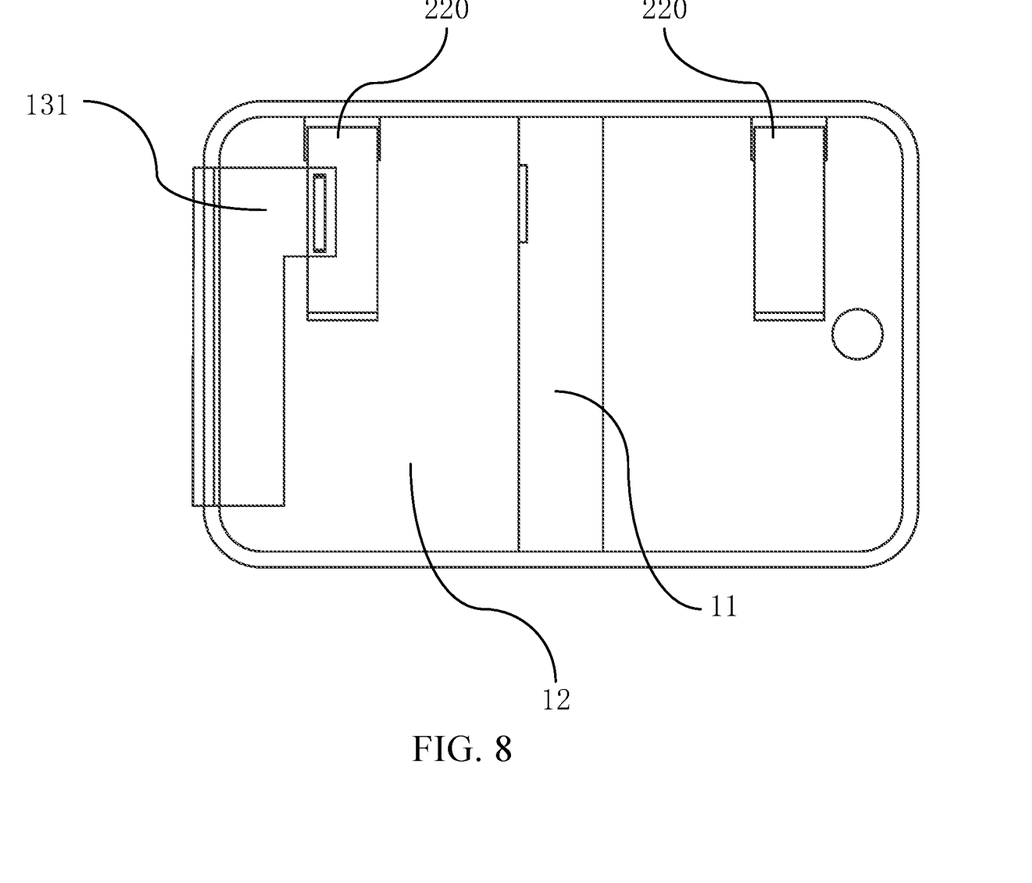
FIG. 8 is a structural schematic diagram of the flexible display module provided by one embodiment of the present application in an assembly state.

In one embodiment of the present disclosure, please combine and refer to FIG. 6 to FIG. 8. The flexible circuit board 200 includes a host board 210, two transfer terminals 220 disposed opposite to each other, and two terminal cables 230. The host board 210 is bonded and attached to the flexible display main body 100 through an optical clear adhesive. The two transfer terminals 200 are disposed on two ends of the flexible circuit board 200 and are electrically connected to the host board 210 through the terminal cables 230. The two transfer terminals 220 are respectively located in bodies of two ends of the foldable screen device and respectively contact to two support structures 12 of the foldable middle frame 10. Through holes 13 are defined in regions where the two support structures 12 directly face toward two transfer terminals 220. After the two transfer terminals 220 has penetrated through the through holes 13, they are bent back to a surface of the foldable middle frame 10 bearing the main board and the battery, and are docked with the main board or the battery at corresponding positions to realize electrical connection, while connection and fixation between the flexible display module 20 and the foldable middle frame 10 are also realized.

Generally, the flexible circuit board 200 is formed by using processes such as sputtering, or etching, etc. on a substrate made of PET or PI, and the circuit is also covered with a protective layer made of a material such as PET, or PI, etc. In this embodiment, a thickness the substrate generally ranges from 30 μm to 50 μm to improve bending performance of the flexible circuit board 200.

In some embodiments of the present disclosure, the two terminal cables 230 extend to a same side of the host board 210 and protrude out of lateral sides of the host board 210 and the flexible display main body 100, the two transfer terminals 220 are respectively disposed on terminal portions of the two terminal cables 230, and after the terminal cables 230 have penetrated through the through holes 13 of the support structure 12, the terminal cables 230 are bent back to a back surface of the flexible display main body 100 and are respectively docked to the corresponding main board and battery to realize electrical connection.

In some embodiments of the present disclosure, a module port 131 is further disposed on a lateral section of the flexible display main body 100; the module port 131 and the transfer terminals 220 are located on adjacent lateral sides of the flexible display module 20; and after the module port 131 has wound through the support structure 12, the module port 131 is bent back to the back surface of the flexible display main body 100 and is buckled on a surface of the transfer terminal 220 facing away the flexible display main body 100.

In some embodiments of the present disclosure, the host board 210 includes a curved portion 211 located at middle and two split portions 212 located on two sides, and two ends of the curved portion 211 are respectively connected to the two split portions 212. The curved portion 211 is disposed corresponding to the bending portion 102. The two split portions 212 are in a shape of a flat plate, are disposed corresponding to the two straight portions 101, and are respectively bonded to back surfaces of the corresponding straight portions 101. The aforesaid two transfer terminals 220 are respectively disposed corresponding to the two split portions 212, and are connected to corresponding split portions 212 through the terminal cables 230 to ensure that the transfer terminals 220 are respectively located in the bodies of two terminals of the foldable screen device to connect to the circuit of the bodies of the two terminals of the foldable screen device, serving a transfer effect.

When the foldable screen device is in a bent state, the two split portions 212 are disposed opposite to each other, and the curved portions 211 are in an arc return-bend shape with a large arc. When the foldable screen device is in an unfolded state, the two split portions 212 are disposed in a juxtaposition manner, and the curved portion 102 is in a straight state or an arc shape with a small arc.

In some embodiments of the present disclosure, the aforesaid curved portion 211 can be constituted by a plurality of returned-bend sections 2111 connected to each other and forming a wave shape, and a cross section of the returned-bend sections 2111 is an arc. The plurality of returned-bend sections 2111 connected to each other and forming the wave shape are beneficial to improve ductility and bending performance of the flexible circuit board 200 to make the entire foldable screen device can have a larger bending angle.

Figure 9:
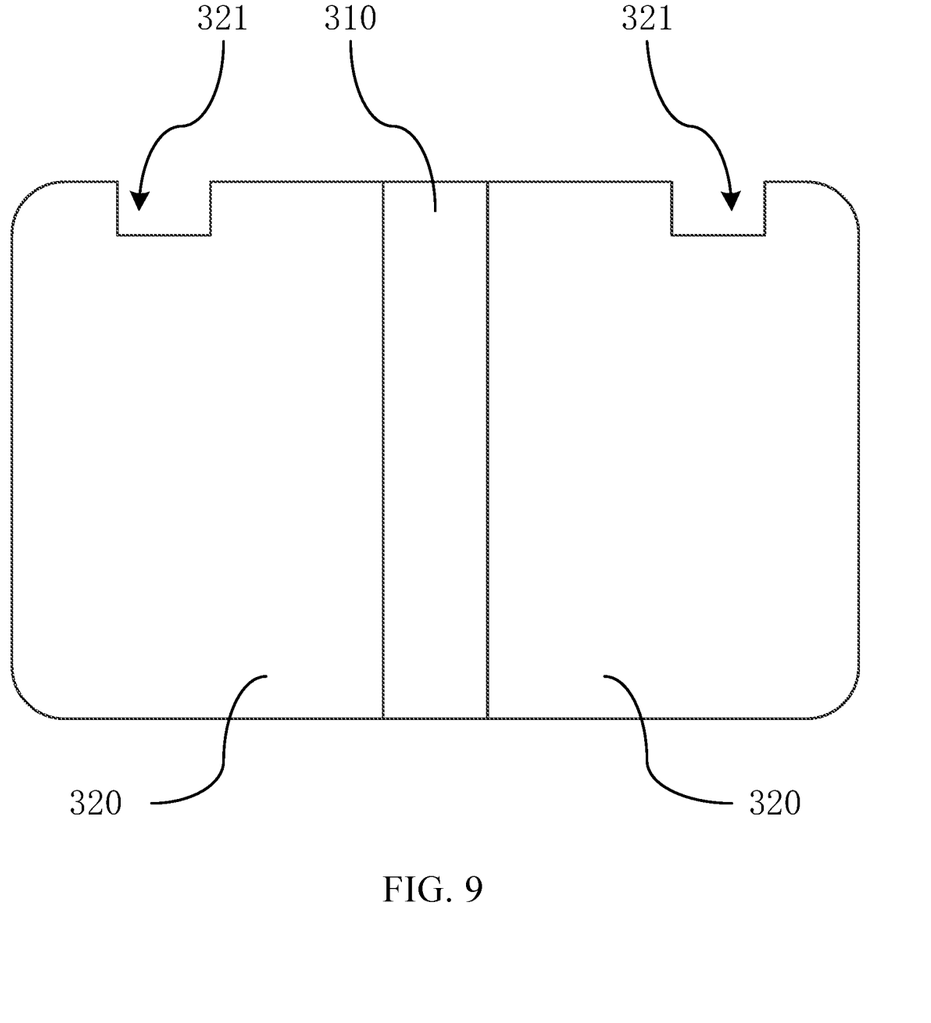
FIG. 9 is a structural schematic diagram of a metal plate provided by one embodiment of the present application.

In one embodiment of the present disclosure, please combine and refer to FIG. 9. The metal plate 300 includes a mesh portion 310 and plate portions 320 disposed on two sides of the mesh portion 310. The two plate portions 320 are in a plate shape and are respectively bonded and connected to the two split portions 212. A plurality of meshes arranged densely are defined in the mesh portion 310, have high ductility and bending performance, directly face the curved portion 211, and are disposed corresponding to the bending portion 102. When the foldable screen device is in the bent state, the plate portions 320 are disposed opposite to each other, and the 310 mesh portion is bent and deformed together with the curved portion 211 and is in an arc return-bend shape with a large arc.

In some embodiments of the present disclosure, the width of the aforesaid mesh portion 310 is equal to the width of the bending portion 102 and is smaller than the width of the aforesaid curved portion 211 to ensure that the width of the curved portion 211 is greater than the width of the bending portion 102. At this time, in the bent state, curved portion 211 is able to wrap the bending portion 102, and the entire flexible display module 20 can have a larger bending angle.

The width of the mesh portion 310 refers to a distance between the two terminals of the mesh portions 310 in the unfolded state of the foldable screen device, i.e., the distance between the two plate portions 320 in the unfolded state of the foldable screen device. The width of the curved portion 211 refers to a distance between the two terminals of the curved portion 211 in the unfolded state of the foldable screen device, i.e., the distance between the two split portions 212 in the unfolded state of the foldable screen device. The width of the bending portion 102 refers to a distance between the two terminals of the bending portion 102 in the unfolded state of the foldable screen device, i.e., the distance between the two straight portions 101 in the unfolded state of the foldable screen device.

In some embodiments of the present disclosure, the flexible circuit board 200 is located between the flexible display main body 100 and the metal plate 300, openings 321 are defined in regions where two plate portions 320 of the metal plate correspond to the transfer terminals 220, and after the transfer terminals 220 have penetrated through the openings 321 and the through holes 13 of the support structure 12, the transfer terminals 220 are bent back to a back surface of the flexible display main body 100 and are respectively docked to the corresponding main board and battery to realize electrical connection. The configuration of the opening 321 can accommodate the terminal cables 230 connected to the transfer terminals 220, prevents wear caused by the terminal cables 230 protruding out of the entire flexible display module, and improves services life of the flexible display module 20.

In the embodiments of the present application, by connecting and fixing the flexible circuit board 200 used for transfer in the foldable screen device to the flexible display main body 100, one flexible display module 20 is integrated and formed. During assembly, the transfer terminals 220 of the flexible circuit board 200 only need to penetrate through the through holes 13 at corresponding positions of the middle frame, then the transfer terminals 220 can connect to the circuits of the bodies on the two ends of the foldable screen device. Compared to a solution of penetrating grooves at rotating shafts in the prior art, the present application is more simple and easy, solves the technical problem that assembly processes of the transfer flexible circuit boards are complicated because the transfer flexible circuit boards 200 need to be formed in a fixed shape and be fixed in the corresponding regions in the prior art. Meanwhile, in the embodiments of the present application, after the flexible circuit board 200 is connected to the circuits of the bodies on the two ends of the foldable screen device, connection and fixation between the flexible display main body 100 and the flexible circuit board 200 are also realized, which further simplifies the assembly structure.

In the aforesaid embodiments, the flexible display main body 100 can be an organic light-emitting diode (OLED) flexible display main body, and can also be a liquid crystal display (LCD) flexible display main body. When the flexible display main body 100 is the OLED flexible display main body, it includes a substrate layer, an anode layer, a conductive layer, an emission layer, and a cathode layer sequentially disposed in a stack. When the flexible display main body 100 is the LCD display main body, it includes an array substrate, a liquid crystal layer, and a color filter substrate sequentially disposed in a stack.

The foldable screen device and the flexible display module thereof provided by the embodiments of the present application are described in detail. This article uses specific cases for describing the principles and the embodiments of the present application, and the description of the embodiments mentioned above is only for helping to understand the method and the core idea of the present application. Meanwhile, for those skilled in the art, will have various changes in specific embodiments and application scopes according to the idea of the present application. In summary, the content of the specification should not be understood as limit to the present application.

What is claimed is:

1. A flexible display module used in a foldable screen device, comprising:
   a flexible display main body; and
   a flexible circuit board comprising a host board and two transfer terminals disposed opposite to each other, wherein the host board is disposed on a surface of the flexible display main body facing away a light-emitting side, and wherein the two transfer terminals are respectively disposed on two ends of the flexible circuit board and are electrically connected to the host board to respectively connect to circuits of bodies on two ends of the foldable screen device;
   wherein a module port is disposed on a side of the flexible display main body, the transfer terminals are bent back to a surface facing away the flexible display main body to connect to the circuits of the bodies on the two ends of the foldable screen device, and the module port is buckled to a surface of the transfer terminals facing away the flexible display main body.

2. The flexible display module as claimed in claim 1, wherein the flexible display module comprises:
   a metal plate disposed on the side of the flexible display main body facing away the light-emitting side, and wherein the flexible circuit board is directly bonded to the metal plate.

3. The flexible display module as claimed in claim 2, wherein the flexible circuit board is bonded to a surface of the metal plate facing toward the flexible display main body.

4. The flexible display module as claimed in claim 3, wherein the flexible display main body is configured to display; the flexible display module comprises:
   a support layer disposed between the flexible display main body and the flexible circuit board, wherein a surface of the support layer is bonded to the flexible display main body to bear the flexible display main body, and another surface of the support layer is directly bonded to the flexible circuit board;
   a polarization layer disposed on a side of the flexible display main body facing away the support layer and bonded to the flexible display main body; and
   a cover plate disposed on a side of the polarization layer facing away the flexible display main body and bonded to the flexible display main body.

5. The flexible display module as claimed in claim 2, wherein the flexible circuit board is bonded to a surface of the metal plate facing away the flexible display main body.

6. The flexible display module as claimed in claim 2, wherein the host board comprises:
   two split portions disposed on the surface of the flexible display main body facing away the light-emitting side in a juxtaposition manner, and wherein at least one of the split portions is connected to the flexible display main body;
   a curved portion located at middle of the host board, wherein two ends of the curved portion are respectively connected to the two split portions.

7. The flexible display module as claimed in claim 6, wherein the metal plate comprises a mesh portion and plate portions disposed on two sides of the mesh portion, the plate portions are respectively connected to and fixed with the two split portions, the mesh portion directly faces to the curved portion, and the mesh portion is curved in a bent state.

8. The flexible display module as claimed in claim 7, wherein a width of the mesh portion is less than a width of the curved portion; and
   wherein the width of the mesh portion refers to a distance between the plate portions in an unfolded state of the foldable screen device, and the width of the curved portion refers to a distance between the two split portions in the unfolded state of the foldable screen device.

9. The flexible display module as claimed in claim 6, wherein the curved portion comprises a plurality of returned-bend sections connected to each other and forming a wave shape, and a cross section of the returned-bend sections is an arc.

10. The flexible display module as claimed in claim 1, wherein the two transfer terminals are located on a same side of the host board and protrude out of a lateral side of the host board.

11. A foldable screen device comprising a foldable middle frame and the flexible display module as claimed in claim 1, wherein the middle frame comprises a folding structure located at middle and a support structure disposed on two sides of the folding structure, the flexible display module is mounted on the support structure, through holes are defined in regions where the support structure directly faces toward the transfer terminals, the transfer terminals penetrate the through holes to connect the circuits of the bodies on the two ends of the foldable screen device.

12. The foldable screen device as claimed in claim 11, wherein the flexible display module comprises:
   a metal plate disposed on the side of the flexible display main body facing away the light-emitting side, and wherein the flexible circuit board is directly bonded to the metal plate.

13. The foldable screen device as claimed in claim 12, wherein the host board comprises:
   two split portions disposed on the surface of the flexible display main body facing away the light-emitting side in a juxtaposition manner, and wherein at least one of the split portions is connected to the flexible display main body; and
   a curved portion located at middle of the host board, wherein two ends of the curved portion are respectively connected to the two split portions.

14. The foldable screen device as claimed in claim 13, wherein the metal plate comprises a mesh portion and plate portions disposed on two sides of the mesh portion, the plate portions are respectively connected to and fixed with the two split portions, the mesh portion directly faces to the curved portion, and the mesh portion is curved in a bent state.

15. The foldable screen device as claimed in claim 13, wherein the flexible circuit board is located between the flexible display main body and the metal plate, openings are defined in regions where two plate portions correspond to the transfer terminals, after the transfer terminals has penetrated the openings and the through holes of the support structure, the transfer terminals are bent back to a back surface of the flexible display main body to connect to the circuits of the bodies on the two ends of the foldable screen device.

16. The foldable screen device as claimed in claim 11, wherein the two transfer terminals are located on a same side of the host board and protrude out of a lateral side of the host board.

17. The foldable screen device as claimed in claim 16, wherein the transfer terminals are bent back to a surface facing away the flexible display main body to connect to the circuits of the bodies on the two ends of the foldable screen device.

18. The foldable screen device as claimed in claim 17, wherein a module port is disposed on a lateral section of the flexible display main body, after the module port has wound through the support structure, the module port is bent back to a surface facing away the flexible display main body and is buckled on a surface of the transfer terminal facing away the flexible display main body.

19. The foldable screen device as claimed in claim 18, wherein the module port and the transfer terminals are located on adjacent lateral sides of the flexible display module.

20. A flexible display module used in a foldable screen device, comprising:
- a flexible display main body; and
- a flexible circuit board comprising a host board and two transfer terminals disposed opposite to each other, wherein the host board is disposed on a surface of the flexible display main body facing away a light-emitting side, and wherein the two transfer terminals are respectively disposed on two ends of the flexible circuit board and are electrically connected to the host board to respectively connect to circuits of bodies on two ends of the foldable screen device;

wherein the flexible display module comprises:
- a metal plate disposed on the side of the flexible display main body facing away the light-emitting side, and wherein the flexible circuit board is directly bonded to the metal plate;

wherein the host board comprises:
- two split portions disposed on the surface of the flexible display main body facing away the light-emitting side in a juxtaposition manner, and wherein at least one of the split portions is connected to the flexible display main body; and
- a curved portion located at middle of the host board, wherein two ends of the curved portion are respectively connected to the two split portions, and the curved portion comprises a plurality of returned-bend sections connected to each other and forming a wave shape, and a cross section of the returned-bend sections is an arc.

* * * * *